United States Patent
Lopez et al.

(10) Patent No.: US 10,438,936 B2
(45) Date of Patent: Oct. 8, 2019

(54) PHOTO-SENSITIVE SILICON PACKAGE EMBEDDING SELF-POWERED ELECTRONIC SYSTEM

(71) Applicant: Texas Instruments Incorporated, Dallas, TX (US)

(72) Inventors: Osvaldo Jorge Lopez, Annandale, NJ (US); Walter Hans Paul Schroen, Dallas, TX (US); Jonathan Almeria Noquil, Bethlehem, PA (US); Thomas Eugene Grebs, Bethlehem, PA (US); Simon John Molloy, Allentown, PA (US)

(73) Assignee: Texas Instruments Incorporated, Dallas, TX (US)

( * ) Notice: Subject to any disclaimer, the term of this patent is extended or adjusted under 35 U.S.C. 154(b) by 17 days.

(21) Appl. No.: 15/820,246

(22) Filed: Nov. 21, 2017

(65) Prior Publication Data
US 2018/0096978 A1    Apr. 5, 2018

Related U.S. Application Data

(60) Division of application No. 15/465,455, filed on Mar. 21, 2017, now Pat. No. 9,859,261, which is a division
(Continued)

(51) Int. Cl.
*H01L 25/16* (2006.01)
*H01L 31/028* (2006.01)
(Continued)

(52) U.S. Cl.
CPC ............ *H01L 25/167* (2013.01); *H01L 21/50* (2013.01); *H01L 23/053* (2013.01); *H01L 23/06* (2013.01); *H01L 23/13* (2013.01); *H01L 23/147* (2013.01); *H01L 24/83* (2013.01); *H01L 25/18* (2013.01); *H01L 25/50* (2013.01); *H01L 27/082* (2013.01); *H01L 27/088* (2013.01); *H01L 29/0657* (2013.01); *H01L 31/02008* (2013.01); *H01L 31/028* (2013.01); *H01L 31/02168* (2013.01); *H01L 31/042* (2013.01);
(Continued)

(58) Field of Classification Search
None
See application file for complete search history.

(56) References Cited

U.S. PATENT DOCUMENTS

7,902,663 B2    3/2011   Fan
8,456,018 B2    6/2013   Park et al.
(Continued)

*Primary Examiner* — Long Pham
(74) *Attorney, Agent, or Firm* — Ross Alyssa Keagy; Charles A. Brill; Frank D. Cimino (57) ABSTRACT

A self-powered electronic system comprises a first chip (401) of single-crystalline semiconductor embedded in a second chip (302) of single-crystalline semiconductor shaped as a container bordered by ridges. The assembled chips are nested and form an electronic device assembled, in turn, in a slab of weakly p-doped low-grade silicon shaped as a container (330) bordered by ridges (331). The flat side (335) of the slab includes a heavily n-doped region (314) forming a pn-junction (315) with the p-type bulk. A metal-filled deep silicon via (350) through the p-type ridge (331) connects the n-region with the terminal (322) on the ridge surface as cathode of the photovoltaic cell with the p-region as anode. The voltage across the pn-junction serves as power source of the device.

5 Claims, 4 Drawing Sheets

Related U.S. Application Data of application No. 14/737,072, filed on Jun. 11, 2015, now Pat. No. 9,640,519, which is a continuation-in-part of application No. 14/537,943, filed on Nov. 11, 2014, now Pat. No. 9,305,852.

(51) Int. Cl.

| | |
|---|---|
| *H01L 31/042* | (2014.01) |
| *H01L 31/0216* | (2014.01) |
| *H01L 27/082* | (2006.01) |
| *H01L 27/088* | (2006.01) |
| *H01L 31/18* | (2006.01) |
| *H01L 31/02* | (2006.01) |
| *H01L 25/00* | (2006.01) |
| *H01L 23/053* | (2006.01) |
| *H01L 23/06* | (2006.01) |
| *H01L 23/13* | (2006.01) |
| *H01L 23/14* | (2006.01) |
| *H01L 21/50* | (2006.01) |
| *H01L 23/00* | (2006.01) |
| *H01L 25/18* | (2006.01) |
| *H01L 29/06* | (2006.01) |
| *H01L 23/498* | (2006.01) |

(52) U.S. Cl.
CPC ...... *H01L 31/1804* (2013.01); *H01L 31/1868* (2013.01); *H01L 23/49844* (2013.01); *H01L 2224/83851* (2013.01); *H01L 2924/01013* (2013.01); *H01L 2924/01014* (2013.01); *H01L 2924/01022* (2013.01); *H01L 2924/01028* (2013.01); *H01L 2924/01079* (2013.01); *H01L 2924/04642* (2013.01); *H01L 2924/04941* (2013.01); *H01L 2924/05042* (2013.01); *H01L 2924/05442* (2013.01); *H01L 2924/10155* (2013.01); *H01L 2924/1305* (2013.01); *H01L 2924/13091* (2013.01); *H01L 2924/1425* (2013.01); *H01L 2924/1427* (2013.01); *H01L 2924/15* (2013.01)

(56) References Cited

U.S. PATENT DOCUMENTS

| | | |
|---|---|---|
| 2010/0044853 A1 | 2/2010 | Dekker et al. |
| 2014/0179061 A1 | 6/2014 | Haba et al. |
| 2015/0162264 A1 | 6/2015 | Chang et al. |
| 2016/0133616 A1 | 5/2016 | Lopez et al. |

PHOTO-SENSITIVE SILICON PACKAGE EMBEDDING SELF-POWERED ELECTRONIC SYSTEM

CROSS REFERENCE TO RELATED APPLICATION

This application is a Divisional of and claims priority to U.S. patent application Ser. No. 15/465,455, filed Mar. 21, 2017, which is a Divisional of U.S. patent application Ser. No. 14/737,072, filed Jun. 11, 2015, that is now U.S. Pat. No. 9,640,519 (issued May 2, 2017), which is a continuation-in-part of U.S. application Ser. No. 14/537,943, filed Nov. 11, 2014, that is now U.S. Pat. No. 9,305,852 (issued Apr. 5, 2016). Both patent applications are incorporated herein by reference.

FIELD

Embodiments of the invention are related in general to the field of semiconductor devices and processes, and more specifically to the structure and fabrication method of low-grade silicon packages, which are photo-sensitive and embedding self-powered electronic circuits and systems.

DESCRIPTION OF RELATED ART

In the majority of today's semiconductor devices, the semiconductor chip is typically assembled on a substrate such as a metallic leadframe or a multi-level laminate, and encapsulated in a package of a robust material such as ceramic or hardened plastic compound. The assembly process typically includes the process of attaching the chip to a substrate pad or the leadframe pad, and the process of connecting the chip terminals to substrate leads using bonding wires, metallic cops, or solder balls.

The use of widely different materials such as metals, ceramics, and plastics cause challenges not only for mutual parts adhesion, but also for long-term device stability; an example is delamination of adjacent parts. The risk of delamination is magnified by the thermos-mechanical stress in temperature swings during operation and testing due to the widely divergent coefficients of thermal expansion (CTE) of the various materials used. For plastic-packaged semiconductor devices, extensive research has been dedicated to identify corrective measures for device reliability issues caused by the stress due to CTE mismatches; so far, degradation due to stress effects could only be mitigated but not eliminated. In addition, moisture-related degradation of electrical characteristics in plastic-encapsulated devices has been well documented, but has been brought under control only to a certain degree. Much effort has further been extended to prevent the onset of fatigue and cracking in metallic connections in devices after operational temperature excursions, again only with limited success.

Among the popular families of power supply circuits are the power switching devices for converting on DC voltage to another DC voltage. Particularly suitable for the emerging power delivery requirements are the Power Blocks with two power MOS field effect transistors (FETs) connected in series and coupled together by a common switch node; such assembly is also called a half bridge. When a regulating driver and controller is added, the assembly is referred to as Power Stage or, more commonly, as Synchronous Buck Converter. In the synchronous Buck converter, the control FET chip, also called the high-side switch, is connected between the supply voltage $V_{IN}$ and the LC output filter, and the synchronous (sync) FET chip, also called the low side switch, is connected between the LC output filter and ground potential. The gates of the control PET chip and the sync FET chip are connected to a semiconductor chip including the circuitry for the driver of the converter and the controller; the chip is also connected to ground potential.

For many of today's power switching devices, the chips of the power MOSFETs and the chip of the driver and controller IC are assembled horizontally side-by-side as individual components. Each chip is typically attached to a rectangular or square-shaped pad of a metallic leadframe; the pad is surrounded by leads as output terminals. In other power switching devices, the power MOSFET chips and the driver-and-controller IC are assembled horizontally side-by-side on a single leadframe pad, which in turn is surrounded on all four sides by leads serving as device output terminals. The leads are commonly shaped without cantilever extensions, and arranged in the manner of Quad Flat No-Lead (QFN) or Small Outline No-Lead (SON) devices. The electrical connections from the chips to the leads may be provided by bonding wires, which introduce, due to their lengths and resistances, significant parasitic inductance into the power circuit, or by clips. These clips are wide and introduce minimum parasitic inductance, but are more expensive than wire bonds and require a more involved assembly process. Each assembly is typically packaged in a plastic encapsulation, and the packaged components are employed as discrete building blocks for board assembly of power supply systems.

In other recently introduced schemes, the control FET chip and the sync FET chip are assembled vertically on top of each other as a stack, with the physically larger-area chip of the two attached to the leadframe pad, and with clips providing the connections to the switch node and the stack top. When both the sync chip and the control chip are assembled source-down, the larger (both physically and active area) sync chip is assembled onto the leadframe pad and the smaller (both physically and active area) control chip has its source tied to the drain of the sync chip, forming the switch node, and its drain to the input supply $V_{IN}$; a clip is connected to the switch node between the two chips. The pad is at ground potential and serves as a spreader of operationally generated heat; the elongated clip of the stack top is tied to input supply $V_{IN}$.

Today's packages of electronic products to more efficiently harvest ambient energy using photovoltaic technologies as replacements for or in augmentation of batteries are bulky and costly.

SUMMARY

Applicants realized that a radically new approach was needed in order to significantly improve semiconductor transistor devices, power blocks and power converters with respect to reducing parasitic resistances and inductances, improving thermal performances and speed, enhancing operational reliability in moist and temperature-variable ambient, and reducing manufacturing cost. The conventional composite package, where semiconductor chips are assembled on a metallic carrier and packaged in a plastic encapsulation, combines materials of widely different coefficients of thermal expansion, leading to a propensity for thermo-mechanical stresses, and requires a lengthy, time-consuming and costly fabrication flow.

Applicants further realized that the market trend, especially for automotive and hand-held applications, requires ever more miniaturized semiconductor products. As an example, this trend favors for DC-DC converter structures, wherein the semiconductor chips are stacked on top of each other in order to save precious real estate, rather than assembled side by side. If photovoltaic power generating technologies are to be widely used for augmenting or replacing conventional power sources, applicants saw that the miniaturization trend called for full integration and embedding of the photovoltaic elements into the converter structures of even the packages of the electronic structures.

Applicants solved the materials, integration, and cost problems of a semiconductor package, when they discovered a structure concept and manufacturing flow for packages, which adopt the mass production and controlled processes of routine semiconductor wafer manufacturing. The new package is based on using silicon slabs cut from wafers made of low-grade and thus low cost silicon, which can be obtained, for instance, from reclaimed, unrefined, and undoped silicon. A p-n junction is created on the slab side exposed to ambient illumination. While processed in wafer form, a slab obtains a depression suitable for assembling a single-crystal device chip, or a stack of chips, and can act concurrently as a carrier, a current-generating cell, and the final package.

The new package concept eliminates leadframes, bonding wires, metallic clips, solder bails, and plastic, ceramic, metallic housings, and power-providing batteries. Instead, the fabrication processes use tried-and-true front-end techniques such as photoresist technologies for etching semiconductors, metals, and insulators, depositing layers of metals, insulators, and passivation, implanting and diffusing doped layers, and growing insulating layers.

In addition, applicants solved the assembly problem of stacking chips without clips, when they discovered a concept and manufacturing flow for chips with completed transistors or circuits, which include the etching of depressions into the completed chips having contours and depth for embedding smaller chips into the depression.

The resulting devices no longer suffer from mismatched coefficients of thermal expansion, but instead avow the minimization of thermo-mechanical stresses. In addition, parasitic resistances and inductances are reduces since wire bonds and clips are eliminated. Thermal conductivity and thus electrical performance of the new devices is enhanced by attaching the chips of the finished devices directly onto circuit boards. In addition, the resulting power blocks and power converters with stacked and embedded chips allow concurrent device miniaturization in x-, y-, and z-dimension.

DETAILED DESCRIPTION OF THE PREFERRED EMBODIMENTS

Figure 1:
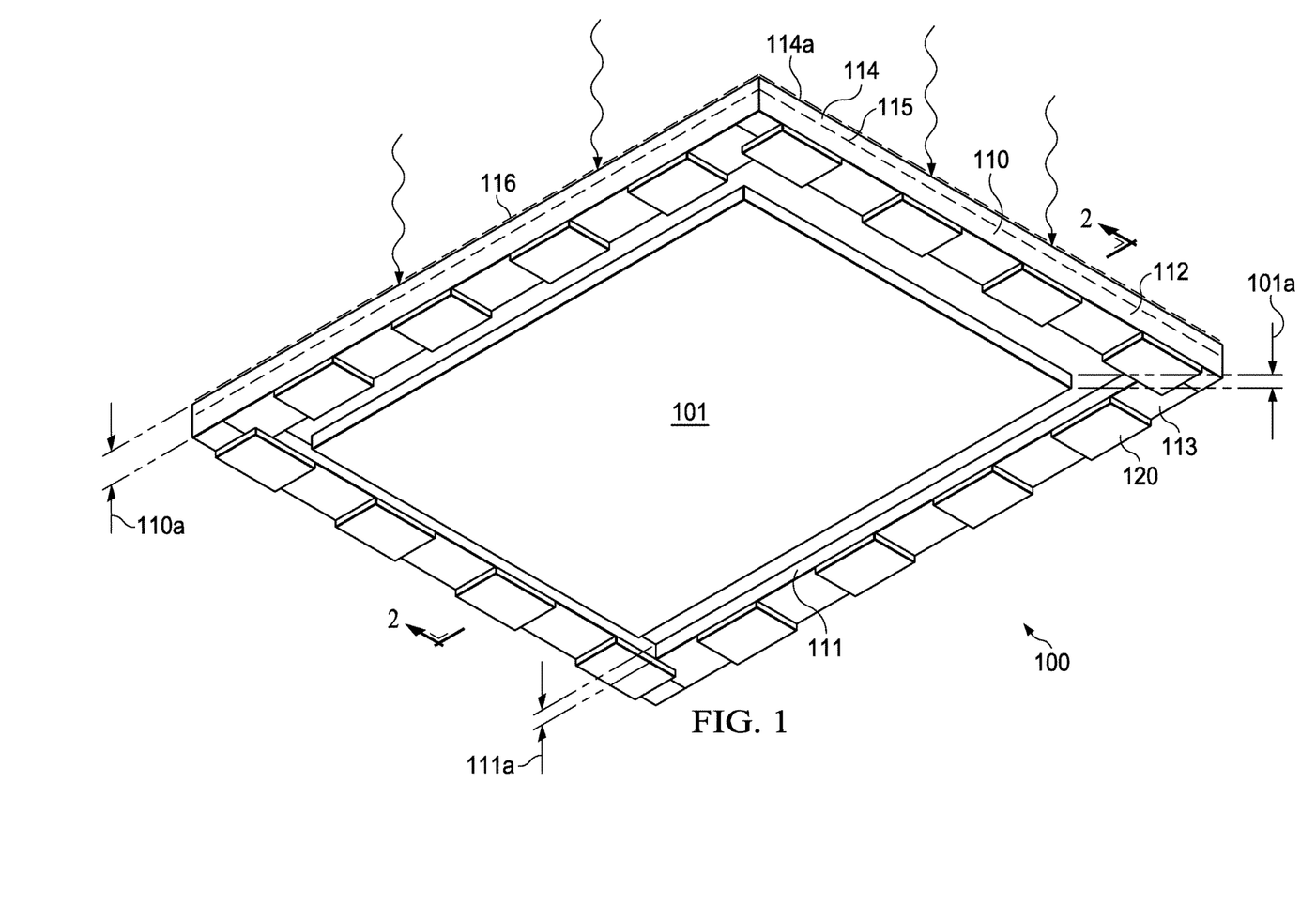
FIG. 1 illustrates a bottom view of an embodiment comprising an integrated circuit device embedded in a p-type low-grade silicon package having an n-type region so that a voltage across the pn-junction serves as a power source of the device.

FIG. 1 illustrates device 100 as an exemplary embodiment of the invention, a semiconductor chip 101 inserted into, and attached to, a slab of low-grade silicon as package 110. The chip includes an integrated circuit (IC) with terminals distributed on the chip side not shown in FIG. 1. In the exemplary embodiment of FIG. 1, semiconductor chip 101 is made of single-crystalline silicon and has a thickness 101a between about 50 and 200 µm. In other embodiments, the semiconductor chip may be made of, for example, silicon-germanium, gallium arsenide, and gallium nitride, or other III-V and II-IV compounds used as semiconductor device materials. In yet other embodiments, the IC may include MOS and bipolar active devices and passive components, drain and gate terminals may be on the first side and attached to the package and the source terminals may be facing away from the package.

In the example of FIG. 1, slab 110 is made of low-grade silicon, wherein the low-grade silicon (I-g-Si) is selected from a group including, but not limited to, reclaimed silicon, unrefined silicon, undoped silicon, polycrystalline silicon, intrinsic polycrystalline silicon, and weakly doped p-type polycrystalline silicon. Preferably, slab 110 of I-g-Si is weakly p-doped. In the example of FIG. 1, slab 110 has a weakly p-doped region 112 and a thickness 110a of about 300 µm, a length 110b of about 5.8 mm, and a width 110c of about 3.7 mm. The surface of the p-doped I-g-Si is covered by an insulating layer, portions of which are exposed at locations 113, while other portions are covered by a metal layer, which is configured as terminals 120 of device 100. The surface of the metal layer is herein called first surface; the first surface is in a first plane.

FIG. 1 shows that the weakly p-doped bulk of slab 110 has on its side opposite chip 101 a heavily n-doped region 114, which forms a pn-junction 115 with the p-type bulk. Furthermore, surface 114a is covered by an antireflective layer 116. Consequently, slab 110 has the prerequisites to act as a photovoltaic cell to enable self-powering of the IC or at least provide augmentation to conventional power sources for operating the IC. FIG. 1 indicates the direction of the incoming light.

As FIG. 1 shows, the bulk of slab 110 is configured as an elevated ridge, or wall, 111 framing a depression. The depression includes a recessed central area suitable to accommodate chip 101. The recessed central area has a second surface in a second plane, which is spaced from the first plane by a depression depth 111a. Preferably, depth 111a is equal to the sum of the chip thickness 101a and the thickness of the adhesive material used to attach chip 101 to the recessed central area. In the example of FIG. 1, depth 111a may be between about 60 and 210 µm.

The attachment of chip 101 is performed, and the layer thickness of the adhesive material is selected, so that the exposed side of the chip is co-planar with the device terminals 120 on slab ridge 110. The depth between the ridge and the central slab area is preferably bridged by a step of the I-g-Si material inclined at an angle less than vertical. Consequently, conductive connections such as metal layers can be formed across the steps, connecting the attachment pads with the device terminals. More preferably, the connections across the steps are covered with a passivation layer.

While the exemplary device of FIG. 1 has the ridge surrounding the central area as a rectangular frame, other embodiments may employ ridge configurations, which include a single linear ridge, two ridges parallel to each other at opposite sides of the central area, or three ridges interconnected by right angles.

With chip 101 inserted in the depression of slab 110, slab 110 can act as the package of the IC device 100. When chip 101 is made of silicon, there is practically no longer any difference of the coefficients of thermal expansion between chip and package, and thermo-mechanical stresses are in first order eliminated. Consequently, the risk of material-related delamination between chip and package is diminished and the device reliability greatly enhanced.

Figure 2:
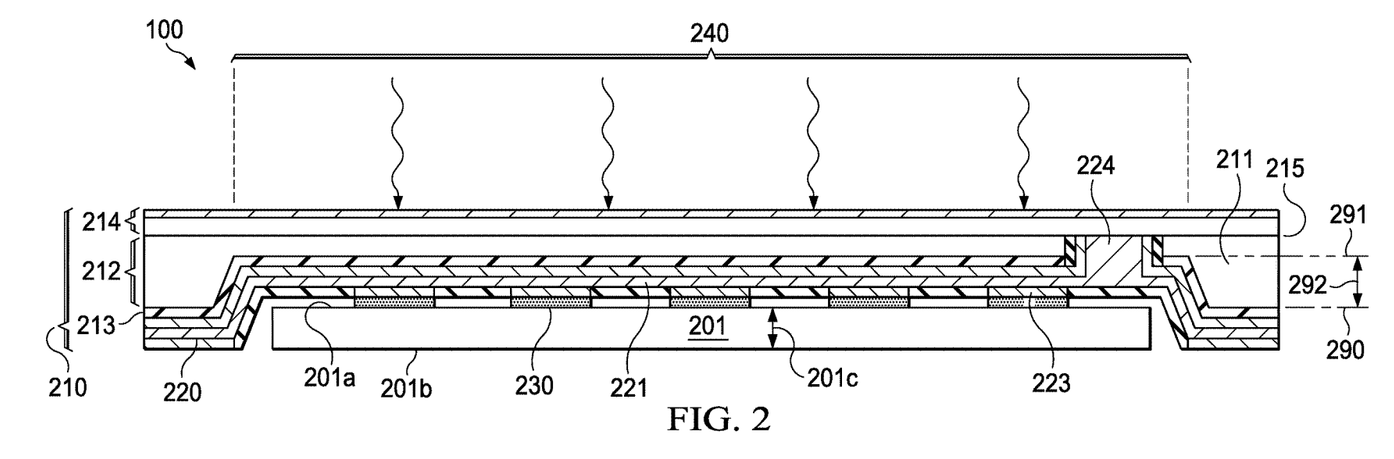
FIG. 2 shows a cross section of the embodiment of FIG. 1 along the line indicated.

In FIG. 2, device 100 includes an integrated circuit (IC) chip 201. A first side 201a of the chip has terminals 230 of the IC embedded in the chip; further, chip 201 includes an opposite second side 201b and a thickness 201c. In addition, device 100 includes a slab 210 of low-grade silicon (I-g-Si) having a first side 212 lightly p-doped, covered by an insulating layer 213 and configured as a ridge 211 framing a depression including a recessed central area 240 suitable to accommodate the chip. The opposite second side 214 is heavily n-doped to form the pn-junction 215 of a photovoltaic cell.

Ridge 211 has a first surface in a first plane 290, and the recessed central area 240 has a second surface in a second plane 291 spaced from the first plane by a depth 292 at least equal to the chip thickness 201a. The ridge covered by a metal layer 220 configured as device terminals, and the central area covered by a metal layer 221 configured as attachment pads 222 for the IC terminals with one pad 223 connected to a metal-filled deep-silicon via 224 extending from the central area to the on-junction 215 and thus to the n+ region. Consequently, pad 223 serves as the cathode of the photovoltaic cell. The connection to the p-doped region, i.e. the anode of the cell, is provided to a chip terminal by a metallization connecting through the insulation layer 213 to the p-doped region 212.

The terminals 230 of the chip are attached to the pads 223 of the central slab area so that the second chip side 201b is co-planar with the device terminals 220 on the slab ridge. Based on this alignment, the slab is enabled to serve effectively as the package of the IC chip including the terminals for connecting to external parts; the package furthermore incorporates a photovoltaic cell capable of powering the integrated circuit of the chip. The electronic system is thus self-powered. As stated earlier, due to the silicon nature of the package, the system is substantially free of CTE differences and thermo-mechanical stress.

Another embodiment of the invention is a method of fabricating semiconductor devices with slabs suitable as device packages as well as photovoltaic cells. In the example of FIG. 2, an integrated circuit (IC) chip 201 is provided, which has IC terminals on the first chip side and is free of terminals on the opposite second chip side. In other examples, the second side of the chip may also have IC terminals.

The fabrication process flow for the slab starts with providing a wafer of low-grade silicon (I-g-Si), which is weakly p-doped and includes a plurality of slab sites. The preferred wafer diameter is 300 mm, but smaller diameters may be used. The wafer has a first thickness, a first surface in a first plane 290, and an opposite second surface. While it is preferred that the final wafer before dicing has a thickness of about 300 µm, it is practical to execute the preceding process steps using a thicker wafer and obtain the final thickness by back-grinding. The wafer is preferably made of lightly p-doped polycrystalline silicon, but for other embodiments, the I-g-Si may be selected from a group including reclaimed silicon, unrefined silicon, undoped silicon, polycrystalline silicon, and intrinsic polycrystalline silicon.

In the next process, the second surface heavily n-type doped in order to create a pn-junction with the lightly p-doped silicon. Then, a first insulating layer covering all slab sites is formed on the first surface. The process of forming the insulating layer is selected from a group including thermally oxidizing silicon, depositing a layer of silicon dioxide, silicon nitride, silicon carbide, or a combination thereof, and depositing a dielectric compound different from a silicon compound.

Next, the first insulating layer is removed from the central portion of each slab site to expose the underlying p-doped I-g-Si, leaving un-removed the insulating layer over peripheral site portions. The exposed p-doped I-g-Si of the central area of each device site is etched, for instance using KOH, to create a depression with a second I-g-Si surface, which has a central fiat portion in a second plane 291 recessed from the first plane 290 at the ridge by a first depth (designated 292 in FIGS. 2 and 101a in FIG. 1). The I-g-Si step of the depression between the first and second planes is preferably inclined at an angle <90° to form slopes, which can be covered by metal layers. As a result, one or more ridges or walls frame the central portion.

Next, a second insulating layer (designated 213 in FIG. 2) is formed on the second I-g-Si surface; the second insulating layer covers the central area of each device site. While other techniques are possible, preferably the second insulating layer is thermally grown so that the silicon dioxide of the second layer merges with the left-over silicon dioxide of the first layer.

In the next process, at least one deep silicon via (DSV) hole is formed in each slab site, extending through the second insulating layer and the p-doped I-g-Si to the pn-junction. In the embodiment in FIG. 2, the via hole is located in the recessed area and starts at second plane 291; for the embodiment in FIG. 3, the via hole is located in the ridge portion and starts at first plane 290. In either case, the via hole is designated to operate as the system input terminal of each slab site. Thereafter, the sidewalk of the via hole are lined with an insulating layer, such as an oxide.

Then, at least one layer of metal is deposited onto the whole wafer including the insulator-covered sidewalk of the DSV. Preferably, the metal layer includes a layer each of a refractory metal such as titanium (adheres well to insulators), titanium nitride, and aluminum. The aluminum layer is preferably thicker than the refractory metal layer; the aluminum also fills the remaining hole of the DSV completely.

The metal layer at each device site is patterned. This process forms the system terminals on the ridges and a plurality of pads, which match the chip terminals in the central portion. While for the embodiment of FIG. 2 one set of pads is sufficient, for other embodiments the pads need to be grouped, for instance, into an inner set and a peripheral set in order to provide for proper attachment of the chip terminals.

It is advantageous the conclude fabrication flow for slabs by depositing a passivation layer onto the wafer surface to cover all device sites, and then removing, at each device site, the passivation layer from the system terminals on the ridges and from the pads in the central portion so that the underlying metal is exposed, but leaving the passivation material over the slopes and between the pads un-removed.

In process flow leading up to the packaged IC system of FIG. 2, a plurality of chips 201 is provided, which include integrated circuits (ICs) with terminals 230 on the first chip side 201a, an opposite second side 201b, and a thickness 201c. The terminals of the first chip sides are then attached to respective pads in the central portion of each slab site. The attachment is performed so that the opposite second chip side 201b is coplanar with the metal layer 220 of the ridges framing each central portion. It is preferred that for the attaching process of the chip to the slab, an adhesive conductive polymeric compound, such as a B-stage epoxy or polyimide, is used. Alternatively, a solder compound or a z-axis conductor may be employed.

After the attachment, the metal layers of the ridges have morphed into device terminal 220, and each slab 210 has morphed into the package of an IC device 100; the package also operates as the photovoltaic cell powering device 100. The above process flow concludes by including the process of sawing the I-g-Si wafer in order to singulate a plurality of slabs 210, each slab packaging a discrete IC device. While saw blades may be used, it is preferred that the sawing process is performed by a laser technique.

Figure 3:
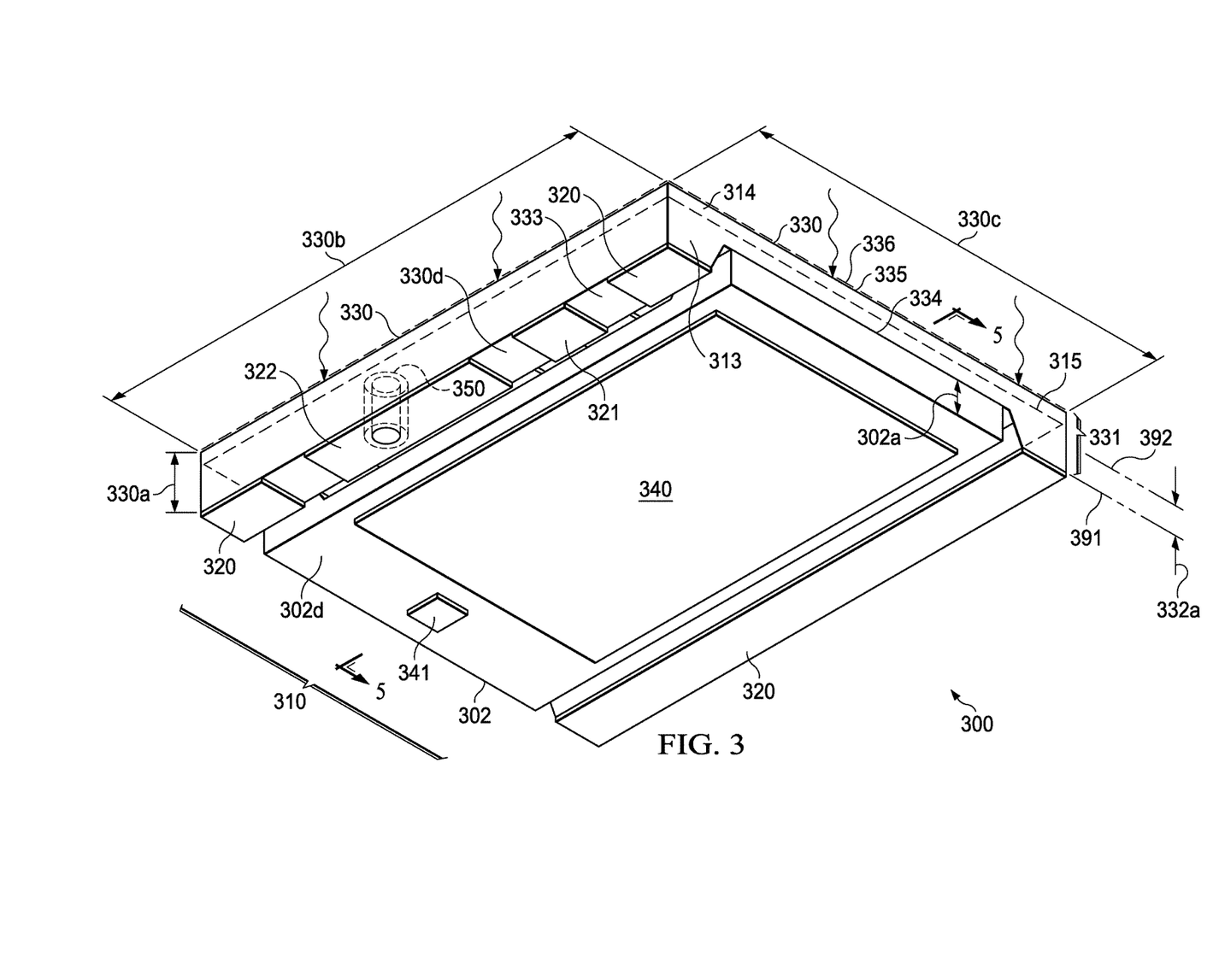
FIG. 3 depicts a bottom view of another embodiment comprising a power converter embedded in a p-type low-grade silicon package having an n-type region so that a voltage across the pn-junction serves as a power source of the converter and a metal-filled deep silicon via through the p-type package connects the pn-junction to an opposite terminal.
Figure 4:
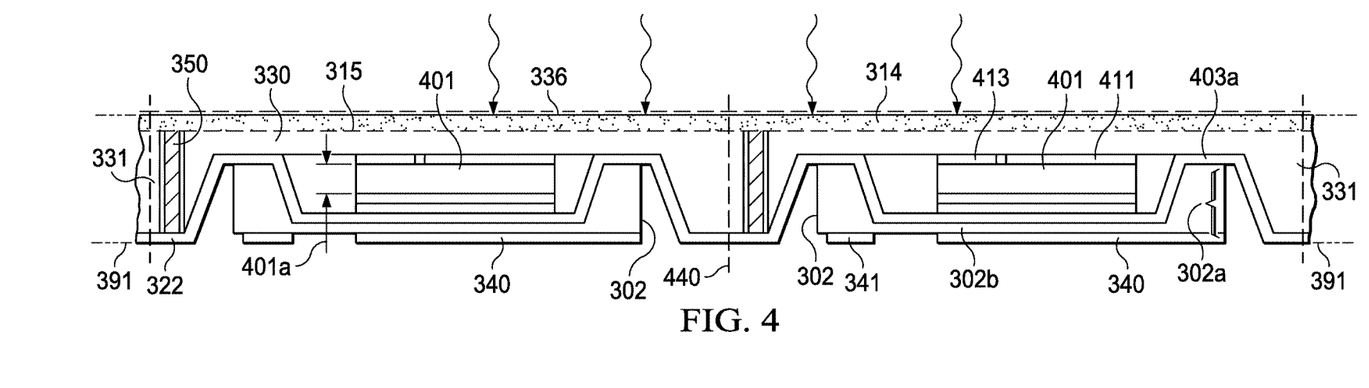
FIG. 4 shows a composite cross section of the embodiment of FIG. 3.
Figure 5:
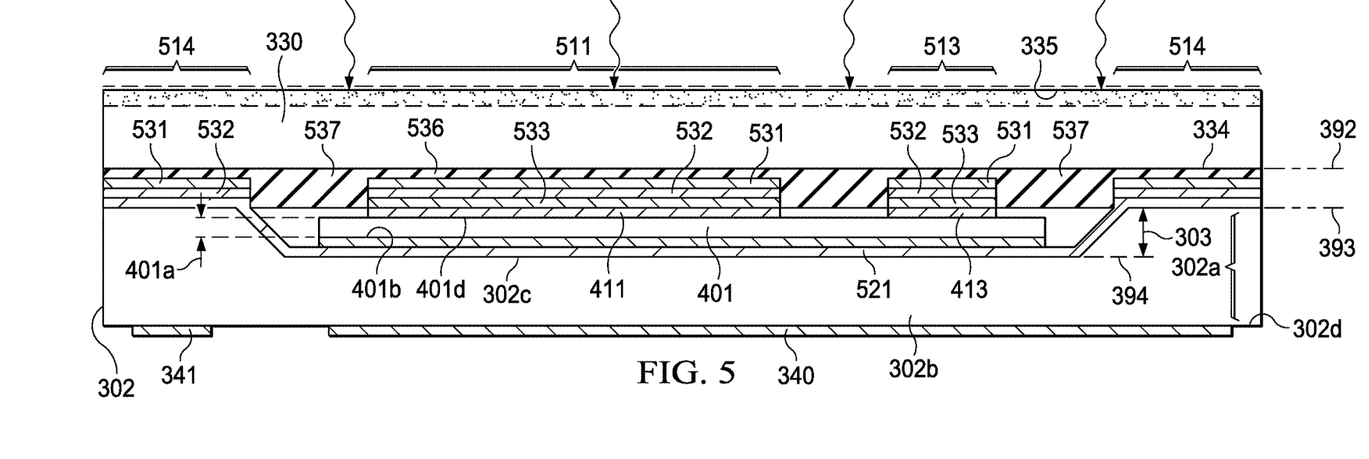
FIG. 5 shows a cross section of the embodiment of FIG. 3 along the line indicated.

Another exemplary embodiment of the invention is illustrated in FIG. 3 as a power block 310 embedded in a slab, or container, 330 of low-grade silicon (I-g-Si), which operates as a photosensitive silicon package for self-powering the system. Container 330 also exhibits certain terminals of the system. FIG. 5 shows a cross section through power block 310 along the lines indicated in FIG. 3; the cross section illustrates the attachments of the transistor chips and the layer sequence of metals and insulators. FIG. 4 depicts a cross section through a plurality of packaged systems after completing the assembly yet before sawing the wafer of low-grade silicon into discrete packaged systems. The cross section illustrates a possible position of the photovoltaic cell embedded in each I-g-Si package.

Referring now to the example of FIG. 3, slab 330 has a flat surface 335 covered by an anti-reflective layer 336. Slab 330 is made of low-grade silicon, wherein the low-grade silicon (I-g-Si) is selected from a group including, but not limited to, reclaimed silicon, unrefined silicon, undoped silicon, polycrystalline silicon, intrinsic polycrystalline silicon, and, most preferred, lowly doped p-type polycrystalline silicon. In FIG. 3, the p-type bulk is designated 313. Slab 330 has a thickness 330a of about 300 μm, a length 330b of about 5.8 mm, and a width 330c of about 3.7 mm. Thickness 330a is herein referred to as first thickness. The slab bottom viewed in FIG. 3 is made of a first insulating layer 333, which determines first plane 391. Portions of the insulating layer are exposed at certain locations, while other portions are covered by a metal layer, which is configured as terminals 320 (for instance, switch node of the power block), terminal 321 (for instance, gate of the high side FET), and terminal 322 (for instance, drain of the high side FET tied to input supply $V_{IN}$) of system 300. The insulating surface of the slab is called herein first surface 330d; the first surface is in a first plane 391.

FIG. 3 shows that the weakly p-doped bulk 331 of slab 310 has on its side opposite the chips a heavily n-doped region 314, which forms a pn-junction 315 with the p-type bulk. Furthermore, surface 335 is covered by an antireflective layer 336. Consequently, slab 330 has the prerequisites to act as a photovoltaic cell to enable self-powering of the power block or at least provide augmentation to conventional power sources for operating the power block. FIG. 3 indicates the direction of the incoming light.

As FIG. 3 shows, slab 330 is configured as a set of elevated ridges 331 framing a depression. In FIG. 3, the system has two parallel ridges; in other embodiments, the system may have more ridges. The depression includes a recessed central area with a surface 334 in a second plane 392, which is spaced from the first plane 391 by depression depth 332a, referred to herein as first depth. The central area is suitable for accommodating at least one semiconductor chip and first depth 332a is preferably equal to the sum of the chip thickness 302a and the thickness of the adhesive material used to attach chip 302 to the recessed central area. In the example of FIG. 3, first depth 332a may be between about 60 μm and 70 μm. As depicted in later figures, the central area is covered by an insulating layer and by patterned metal layers configured as attachment pads for device terminals such as transistor terminals.

FIG. 3 indicates an example for the position of metal-filled DSV 350, which transects the p-doped region 313 of a slab ridge in order to connect the cathode of the photovoltaic cell (pn-junction 315) with terminal 322, which is tied to input supply $V_{IN}$.

The exemplary position of conductive DSV 350 is also shown in FIG. 4, which depicts a portion of an I-g-Si wafer 330 with a plurality of slab sites after completing the assembly of first FET chip 401 and second FET chip 302 in each slab site. There is at least one DVS 350 for each slab site for allowing self-powering of the electronic system assembled in each site. As FIG. 4 shows, for each slab site the assembly encompasses a first chip 401 embedded in the depression 302b of a second chip 302 and, in turn, the second chip embedded in the depression of a respective slab 330. Second chip 302 is formed as a container including a depression 302b bordered by ridges 302a.

The embedded positions imply that after assembly, two co-planarities have to be achieved: The metallization 411 of the first chip has to be co-planar with the ridge metallization 403a of the second chip, and the metallization 340 of the second chip has to be co-planar with the ridge metallization 322 of the I-g-Si slab. In FIG. 4, the plane of the latter co-planarity is designated 391; it is referred to herein as first plane.

For the operation of the power block with the support of the photovoltaic cell, metal 340 will be at ground potential (anode of the cell) and metal 322 will be at input potential $V_{IN}$ (cathode of the cell). In FIG. 4, the cut lines through the wafer for separating the slab sites into discrete electronic systems in the singulation process are marked 440.

The portion of power block 310 visible in FIG. 3 is single-crystalline semiconductor chip 302, which is referred to herein as second chip (first chip 401 is illustrated in FIGS. 4 and 5). In the example of FIG. 3, chip 302 is made of heavily doped single-crystalline silicon, which allows direct contact to a metal layer 340 often referred to as back metal. The doped silicon is topped by an epitaxial layer of intrinsic silicon, which includes a drain-down MOS field effect transistor (FET) serving as the low side transistor of the power block and is herein referred to as the second semiconductor chip. Chip 302 has a thickness 302a, which may for instance be about 50 μm; thickness 302a is herein referred to as third thickness. Third thickness 302a is smaller than first thickness 330a, but greater than second thickness 401a (which is depicted in FIGS. 4 and 5 as the thickness of the first semiconductor chip 401). Chip 302 has a flat side 302d, which is visible in FIG. 3; flat side 302d is referred to herein as the third side.

The exemplary MOS FET of FIG. 3 has its source terminal 340 and gate terminal 341 on the third side facing away from slab 330. Source terminal 340 is electrically tied to ground potential. In other embodiments, the semiconductor chip may be made of, for example, silicon-germanium, gallium arsenide, and gallium nitride, or other III-V and II-VI compounds used as semiconductor device materials. In yet other FET embodiments, the drain terminal may be facing away from the slab. In still other embodiments, the transistor may be a bipolar transistor having the collector contact facing away from the slab; or the bipolar transistor may have the emitter terminal facing away from the slab.

Since FIG. 5 shows a cross section of system 300 along the lines indicated in FIG. 3, the ridges of slab 330 are not represented; FIG. 5 rather shows the flat surface 335 of the slab, covered by anti-reflective layer 336, and the flat surface 334 of the recessed central area, which is in the second plane 392. FIG. 5 further displays a first semiconductor chip 401 and a second semiconductor chip composed of a central portion 302b with ridges 302a, operating as a container for first chip 401. Both chips are made of a single-crystalline semiconductor material, which may for instance be silicon. For the central portion 302b of the second chip, FIG. 5 indicates flat side 302d, which is referred to herein as third side. The contour of second chip 302 is configured as a set of ridges 302a with a surface in third plane 393 parallel to plane 392; ridges 302a frame a depression. In FIG. 5, the second chip has two parallel ridges; in other embodiments, the second chip may have more ridges. The depression includes a recessed flat central area with a surface 302c in a fourth plane 394 parallel to plane 393. The central area is suitable to accommodate first chip 401, which is thus embedded in the second chip. FIG. 5 illustrates that fourth plane 394 is spaced from the third plane 393 by a second depth 303 smaller than the first depth 332a and suitable to accommodate the thickness of first chip 401 with its metal layers and layers of attachment material.

FIG. 5 indicates that fourth side 302b of chip 302 is uniformly covered by a metal layer 521, which is sometimes referred to as back metal. Preferably, layer 521 includes a layer of refractory metal (such as titanium or tungsten) for adhesion to the semiconductor crystal, followed by a layer of nickel and an outermost layer of a noble metal (such as silver, palladium, or gold). In some products, the refractory metal layer is omitted. In a similar fashion, portions of the third side 302d of chip 102 also have a sequence of stacked layers of similar metal selections, for example titanium, nickel, and silver, or just nickel and gold. The stacked metal layers are patterned into pads 340 and 341.

In the exemplary embodiment of FIG. 5, chip 302 includes a field effect transistor (FET), which serves as the low-side FET of the power block. As mentioned, the bulk single-crystal silicon of chip 302 is heavily doped and makes good contact to the so-called back metal layer 521. In this example of FIG. 5, metal layer 521 serves as the drain terminal of the low-side FET, electrically tied to the switch node, pad 340 is the source terminal electrically tied to ground potential, and pad 341 the gate terminal of the low-side FET.

Based on its smaller size and thickness, first chip 401 is embedded in the depression of second chip 302. With both first side 401d and second side 401b of first chip 401 flat, first chip 401 has thickness 401a smaller than second depth 303 so that first chip 401 together with its metal layers and attachment layers can be embedded in the depressed central area of second chip 302. In the exemplary embodiment of FIG. 5, chip 401 includes a field effect transistor (FET), which serves as the high-side FET of the power block and has terminals on the first and the second chip side. In this example, the metal pad 411 of the first chip side 401d serves as the drain terminal of the high-side FET, electrically tied to the input supply $V_{IN}$, and pad 413 is the gate terminal of the high-side FET.

As FIG. 5 illustrates, the I-g-Si material of slab 330 is covered by an insulating layer 536, preferably thermally grown silicon dioxide. (The fact that in some places the insulating layer has increased thickness 537 is a secondary effect of the patterning of the metal layer, discussed by the process flow below.) Insulating layer 536, in turn, is covered by a metal layer. While one metal layer may be sufficient, FIG. 5 illustrates a preferred method of a sequence of metal layers. The first layer 531 is made of a refractory metal such as titanium, followed by a compound layer such as titanium nitride. Alternative choices include a layer of tungsten, or titanium-tungsten, or another refractory metal. The refractory metal adheres strongly to insulating layer 536. Then, a layer 532 of aluminum is deposited onto the refractory metal layer; layer 532 is preferably thicker than layer 531. For some applications, it is preferred to deposit a layer of nickel and a thin layer of gold (both layers designated 533 in FIG. 5) on top or the aluminum layer 532 in order to facilitate the attachment of transistor terminals.

The metal layers 531 and 532 (and optional 533) are patterned in the depressed central area of slab 330. The result of the patterning may be a plurality of pads grouped into an inner set and a peripheral set, which may be required by the chips to be attached. In this example, the pads of the inner set match the terminals of the transistors of the first chip 401, and the pads of the peripheral set match the terminals of the ridges of second chip 302. For the first chip 401 of FIG. 5, the patterned metal pads of the inner set include the drain terminal 511 and the gate terminal 513 of the high-side FET. For the second chip 302 of FIG. 5, the patterned metal pads of the peripheral set include the switch node terminals 514 of the power block, which combines the source terminal of the high-side FET and the drain terminal of the low-side FET.

FIGS. 4 and 5 indicate the antireflective layer 335 on flat surface 335 of the heavily n-doped region 314. However, a conductive DSV for contacting pn-junction 315 is not shown in FIG. 5, since the contact to the pn-junction traverses the ridge region of the silicon package in order to tie into the input supply terminal of the system.

Another embodiment of the invention is a method for fabricating a packaged and self-powered electronic system. Taking as an example the power block illustrated in FIGS. 3, 4, and 5, the process flow starts by providing a wafer of lightly p-doped low grade silicon (I-g-Si) including a plurality of slab sites. The wafer has a first thickness 330a, a first surface 334 in a first plane 391, and an opposite second surface 335 doped heavily n-type to create a pn-junction 315 with the lightly p-doped silicon. Second surface 335 of the wafer may include an anti-reflective layer.

Each slab site is configured as a ridge 331 in the first plane framing a depression, which includes a recessed central area in a second plane 392 spaced from the first plane by a first depth 332a. The ridge and the central area are covered by a metal layer patterned into pads 511, 513, and 514 for contacting chip terminals. Each site further has a metal-filled via hole 350 in the ridge designated as the system input terminal; the via hole extends from the pn-junction 315 through the p-doped I-g-Si 331 to the first surface 391.

In the next process, a plurality of first semiconductor chips 401 is provided, which have a flat first side 401b and an opposite flat second side 401d, and a second thickness

401a smaller than the first thickness 330a. The first chips may include field effect transistors with terminals on the first and the second side.

Then, a first chip is attached with the terminals of its first chip side to respective pads of the central area of each I-g-Si slab. A preferred material for the attach process is a conductive adhesive, which can be employed for all following attach processes. By this process, sub-assemblies are created, wherein the terminals of the second chip side face towards the first plane.

Next, a plurality of second semiconductor chips 302 is provided, which have a flat third side 302d and an opposite contoured fourth side, and a third thickness 302a smaller than the first thickness 330a but greater than the second thickness 401a. The fourth side configured as a ridge, or wall, with its top surface in a third plane 393; the ridge frames a depression including a flat central area in a parallel fourth plane 394 recessed from the third plane by a second depth 303 smaller than the first depth and suitable to accommodate the first chips. The fourth side uniformly is metallized. The second chips may include field effect transistors with terminals on the third and the fourth side.

Using the subassemblies mentioned above for the next process, the metallized depressed central area of the fourth side of a second chip is attached to the terminals on the second side of the respective first chip, and concurrently the metallized ridges of the second chip are attached to respective pads of the central I-g-Si area. As a result of these simultaneous processes, the transistor terminals on the third side of the second chips are co-planar with the metal layer on the ridges of the respective I-g-Si slab.

The method may conclude with the process of dicing the I-g-Si wafer to singulate discrete multi-output devices. In the example described above, each discrete device has transistor chips embedded in an I-g-Si slab as a package, wherein the package is photo-sensitive so that the embedded electronic system, a power block, may be self-powered or used as a back-up or tandem source for a battery. The first and second chips may be MOS field-effect transistors and the electronic system a power block, or they may be bipolar transistors and the electronic system a regulator.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention applies not only to field effect transistors, but also to other suitable power transistors, to bipolar transistors, insulated gate transistors, thyristors, and others.

With the on-board photovoltaic cell, the application to regulators, multi-output power converters, other applications with sensing terminals and Kelvin terminals, offer advantages under circumstances where line power is insufficient, such as remote monitoring.

It is therefore intended that the appended claims encompass any such modifications or embodiments.

We claim:

1. A method for fabricating a packaged and self-powered electronic system, comprising:
    providing a wafer of lightly p-doped low-grade silicon (I-g-Si) including a plurality of slab sites, the wafer having a first thickness, a first surface in a first plane, and an opposite second surface doped heavily n-type to create a pn-junction with the lightly p-doped silicon, each site configured as a ridge in the first plane framing a depression including a recessed central area with a second surface in a second plane spaced from the first plane by a depth, the ridge and the central area covered by a metal layer patterned into pads for contacting chip terminals, each site having a metal-filled via hole in the central area designated as the system input terminal, the via hole extending from the pn-junction through the p-doped I-g-Si to the second surface;
    providing a semiconductor chip having a flat first and an opposite flat second side, and a second thickness smaller than the depth, the chips including integrated circuits having terminals on the first side;
    attaching the semiconductor chip with the terminals on the first side to respective pads of the central area of each I-g-Si slab, whereby the second chip side is co-planar with the metal layer on the ridge of the respective I-g-Si slab.

2. The method of claim 1 wherein the second surface of the wafer includes an anti-reflective layer.

3. The method of claim 2 wherein the process of attaching employs conductive adhesives.

4. The method of claim 3 further including the process of dicing the I-g-Si wafer to singulate discrete multi-output devices, each having the semiconductor chip embedded in the I-g-Si slab as a package.

5. The methods of claim 1, wherein the process of providing a wafer of low-grade silicon (I-g-Si) includes the processes of:
    providing a wafer of lightly p-doped I-g-Si including a plurality of slab sites, the wafer having a first thickness, a first surface in a first plane, and an opposite second surface;
    doping the second surface heavily n-type to create a pn-junction with the lightly p-doped silicon;
    forming a first insulating layer on the first surface, the first insulating layer covering all slab sites;
    removing the first insulating layer from the central portion of each slab site to expose the underlying p-doped I-g-Si, leaving un-removed the insulating layer over the peripheral site portions;
    etching the exposed p-doped I-g-Si of the central area of each device site to create a depression with a second I-g-Si surface having a central flat portion in a second plane recessed from the first plane by a first depth, and slopes between the first and the second I-g-Si surface, leaving the first I-g-Si surface on a ridge framing the central portion;
    forming a via hole in the designated as the system input terminal of each slab site, the via hole extending from the pn-junction through the p-doped I-g-Si to the surface, then lining the sidewalls of the via hole with an insulating layer, and filling the via hole with a metal;
    forming a second insulating layer on the second I-g-Si surface, the second insulating layer covering the central area of each device site;
    depositing at least one layer of metal onto the whole wafer, the metal of the layer contacting the via hole; and
    patterning the metal layer at each device site, thereby forming system terminals on the ridges and a plurality of pads matching chip terminals in the central portion.

* * * * *